United States Patent
Kim et al.

(10) Patent No.: US 6,841,496 B2
(45) Date of Patent: Jan. 11, 2005

(54) LOW TEMPERATURE CO-FIRING CERAMIC (LTCC) COMPOSITION FOR MICROWAVE FREQUENCY

(75) Inventors: Hyun-Jai Kim, Seoul (KR); Seok-Jin Yoon, Seoul (KR); Ji-Won Choi, Seoul (KR); Chong-Yun Kang, Seoul (KR); Jong-Yoon Ha, Seongnam-si (KR)

(73) Assignee: Korea Institute of Science and Technology, Seoul (KR)

( * ) Notice: Subject to any disclaimer, the term of this patent is extended or adjusted under 35 U.S.C. 154(b) by 21 days.

(21) Appl. No.: 10/313,659

(22) Filed: Dec. 5, 2002

(65) Prior Publication Data

US 2003/0211931 A1 Nov. 13, 2003

(30) Foreign Application Priority Data

May 13, 2002 (KR) ........................................ 2002-26115

(51) Int. Cl.$^7$ ............................................ C04B 35/465
(52) U.S. Cl. ........................................................ 501/136
(58) Field of Search .................................. 501/135, 136

(56) References Cited

FOREIGN PATENT DOCUMENTS

| JP | 58-84099 | * | 7/1976 |
|----|----------|---|--------|
| KR | 10-307886 |   | 8/2001 |

* cited by examiner

Primary Examiner—Karl Group
(74) Attorney, Agent, or Firm—Jones Day

(57) ABSTRACT

The invention relates to a low temperature co-firing ceramic (LTCC) composition for microwave frequency represented by the following formula 1:

$$Ca[(Li_{1/3}Nb_{2/3})_{1-x}Ti_x]O_{3-\delta}+y(B_2O_3.ZnO.SiO_2.PbO) \qquad (1)$$

wherein x is molar ratio and $0 \leq x \leq 0.3$; and y is wt % ratio and $0 \leq y \leq 15$. The present invention relates to dielectric LTCC composition for microwave frequency that has high dielectric constants, high Q values, and stable temperature coefficients of the resonant frequency, and has sintering temperature as low as $\leq 900°$ C. so as to be co-fired without reaction with an electrode such as silver (Ag). The compositions have excellent characteristics required to cellular phones and PCS in the range of 800 MHz~1.9 GHz, which is commonly used, and laminated chip filters and antennas in the range of IMT 2000 of 2 GHz, which will be used.

1 Claim, No Drawings

LOW TEMPERATURE CO-FIRING CERAMIC (LTCC) COMPOSITION FOR MICROWAVE FREQUENCY

FIELD OF THE INVENTION

The present invention relates to a dielectric ceramic composition for high frequency with high dielectric constants, high Q values, and good temperature coefficients in the resonant frequencies. More specifically, the present invention relates to a low temperature co-firing ceramic composition for microwave frequency that has a sintering temperature as low as $\leq 900°$ C. and can be co-fired with an electrode such as silver (Ag).

BACKGROUND OF THE INVENTION

There have been recent remarkable developments in communication systems that use microwave frequencies with a range of 300 MHz to 300 GHz in mobile communications such as wireless telephone sets and car-phones, satellite broadcastings, satellite communications and the like. With the development of personal portable communications, miniaturization of terminals has become generalized. Thus, laminated parts are increasingly required to accomplish miniaturization, high light weighting, and surface mounting of terminal parts. Particularly, passive elements such as filters, duplexers, resonators and antennas, which are essential parts of communication equipment, were difficult to miniaturize. However, miniaturized thick film laminated chip elements were obtained with the use of low temperature sintering materials that can be co-fired with an electrode, such as silver (Ag) or copper (Cu). High dielectric constant and high frequency are required for miniaturization of parts because the wavelength of microwaves within dielectric ceramics is inversely proportional to the square root of a dielectric constant, and the frequency. Generally, a dielectric constant ($\epsilon_r$) is inversely proportional to a quality factor (Q) value, and dielectric materials having a high dielectric constant are required for miniaturization of parts. However, as the frequency in use is increased to $\geq 1~2$ GHz, the parts are sufficiently miniaturized. Thus, materials having dielectric constants with a range of 20~40 are now actively applied to a variety of chip antennas, chip filters and the like.

The representative examples of low temperature sintering dielectric ceramics for high frequency, which have been developed, include CuO and $V_2O_5$ containing the $BiNbO_4$ system, of which the $Q \cdot f_0$ value is 18,300 GHz, the dielectric constant is 43, and the temperature coefficient of resonant frequency is +38 ppm/° C. These types of dielectric ceramics have sintering temperatures as low as 875° C., but have very high temperature coefficients of resonant frequency. Thus, they are impossible to apply to actual parts. Therefore, study of adding various additives to the $BiNbO_4$ system to stabilize the temperature coefficient of resonant frequency is now in energetic progress (See, H. Kagata, Jpn. J. Appl. Phys., 31, p.3152, 1992). Bismuth (Bi) reacts with electrodes when a $BiNbO_4$ system is in laminated sintering, causing a characteristic deterioration of the $BiNbO_4$ system (see, K. B. Shim, J. Mater. Sci., 35, p.813, 2000). Thus, a demand is rising for low temperature sintering dielectric ceramics materials that do not include Bi.

SUMMARY OF THE INVENTION

The object of the present invention is to provide solutions to the aforementioned problems in the art and provide a low temperature co-firing ceramic composition for microwave frequency that, (i) can be sintered at a low temperature ($\leq 900°$ C.); (ii) does not react with a dielectric ceramic material when co-firing with an electrode such as silver (Ag); (iii) have dielectric constants with a range of 20~40, and have a high quality factor (Q) value applicable to parts; (iv) as well as have a stable temperature coefficient of resonant frequency.

DETAILED DESCRIPTION OF THE PRESENT INVENTION

The object of the invention is achieved by providing a dielectric ceramic composition represented by the following formula 1:

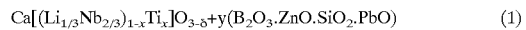

$$Ca[(Li_{1/3}Nb_{2/3})_{1-x}Ti_x]O_{3-\delta} + y(B_2O_3 \cdot ZnO \cdot SiO_2 \cdot PbO) \qquad (1)$$

wherein x is molar ratio and $0 \leq x \leq 0.3$; y is wt % ratio and $0 \leq y \leq 15$; and $\delta$ is a variable varying with the value of x and $7/60 \leq \delta \leq 1/6$.

The dielectric ceramic composition according to the present invention has dielectric constants of 23.4 to 46.2; a $Q \cdot f_0$ value of 6,300 to 17,240 GHz; a temperature coefficient of resonant frequency (TCF) of -72.4 to +64.3 ppm/° C., which can be controlled to 0 ppm/° C. with the constitution change; and can be used as low temperature co-firing ceramics (LTCC), which is applied to dielectric ceramics parts for microwave frequency.

The properties of the LTCC composition for microwave frequency according to the present invention vary depending on the amount of $TiO_2$ to be contained in $Ca[(Li_{1/3}Na_{2/3})_{1-x}Ti_x]O_{3-\delta}$ and the amount of $B_2O_3 \cdot ZnO \cdot SiO_2 \cdot PbO$ to be added. As the molar fraction of $TiO_2$ is increased from 0 mole % to 30 mole %, and the amount of $B_2O_3 \cdot ZnO \cdot SiO_2 \cdot PbO$ to be added is increased from 10 wt % to 15 wt % at a sintering temperature of 900° C., the dielectric constants are gradually increased from 23.4 to 46.2, and the $Q \cdot f_0$ values are gradually decreased from 17,240 to 6,300 GHz. Also, as the molar fraction of $TiO_2$ and the addition amount of $B_2O_3 \cdot ZnO \cdot SiO2 \cdot PbO$ are increased, the temperature coefficient of resonant frequency is gradually increased from -72.4 to 64.3 ppm/° C. By this, the temperature coefficient of resonant frequency may be controlled. In particular, when the composition, in which $TiO_2$ is contained in the amount of 20~25 mole % and $B_2O_3 \cdot ZnO \cdot SiO2 \cdot PbO$ added in the amount of 10~12 wt %, is sintered at 900° C., an excellent LTCC composition for microwave frequency may be prepared wherein the dielectric constants are 35.5~42.4, the $Q \cdot f_0$ values are 9400~14250 GHz, and the temperature coefficient of resonant frequency is -10~+10 ppm/° C.

The present invention is explained in detail through the examples given below. However, the examples presented here are for illustrative purposes only and should not be construed as limiting the invention.

EXAMPLE $CaCO_3$, $Li_2CO_3$, $Nb_2O_5$, $TiO_2$ were weighed in a constitution ratio (x, mole ratio) indicated in Table 1, and mixed. The mixtures were calcined for 2 hours at a temperature of 850° C., and then milled. $B_2O_3 \cdot ZnO \cdot SiO_2 \cdot PbO$ was added to the mixtures in a given weight ratio (y, wt % ratio) indicated in Table 1, and then mixed. Subsequently, PVA aqueous solutions were added as forming additives. The mixtures were pressed into cylinder-type specimens having a diameter of 10 mm and a thickness of 5 to 6 mm. The cylinder-type specimens were heated for 1 hour at a temperature of 600° C. to remove organic binders and then sintered for 0.1~3 hours at a temperature of 800~1000° C. in air.

Both sides of the sintered specimens were thoroughly polished in a parallel fashion and introduced into a waveguide. Dielectric constants, Q values and temperature coefficients of the resonant frequency of the specimens were measured at a frequency range of 7~10 GHz and temperature range of 20~80° C., according to a dielectric resonator method. The microwave dielectric properties of each specimen are shown in Table 1.

TABLE 1

High Frequency Dielectric Properties of
Ca[(Li$_{1/3}$Nb$_{2/3}$)$_{1-x}$Ti$_x$]O$_{3-\delta}$ + y(B$_2$O$_3$.ZnO.SiO$_2$.PbO)

| Sample No. | Constitution X (mole) | δ (mole) | Addition y (wt %) | Sintering Temperature (° C.) | Dielectric constant ($\epsilon_r$) | Q · f$_0$ (GHz) | τ$_f$ (ppm/° C.) |
|---|---|---|---|---|---|---|---|
| 1 | 0.00 | 1/6 | 0 | 1150 | 29.6 | 40000 | −21.0 |
| 2 | | | 10 | 900 | 23.4 | 17240 | −72.4 |
| 3 | | | 12 | | 27.0 | 15620 | −60.3 |
| 4 | | | 15 | | 28.2 | 13240 | −47.8 |
| 5 | 0.05 | 19/120 | 0 | 1150 | 32.4 | 29800 | −4.5 |
| 6 | | | 10 | 900 | 24.4 | 16280 | −60.6 |
| 7 | | | 12 | | 29.4 | 15140 | −52.4 |
| 8 | | | 15 | | 31.7 | 11940 | −44.5 |
| 9 | 0.10 | 3/20 | 0 | 1150 | 34.6 | 27200 | −2.3 |
| 10 | | | 10 | 900 | 26.3 | 15910 | −52.6 |
| 11 | | | 12 | | 32.1 | 14690 | −45.2 |
| 12 | | | 15 | | 34.8 | 10610 | −40.4 |
| 13 | 0.15 | 17/120 | 0 | 1150 | 36.8 | 26600 | −1.7 |
| 14 | | | 10 | 900 | 29.9 | 15120 | −39.0 |
| 15 | | | 12 | | 34.2 | 13240 | −37.7 |
| 16 | | | 15 | | 37.5 | 9700 | −35.9 |
| 17 | 0.20 | 2/15 | 0 | 1150 | 38.6 | 26100 | 0 |
| 18 | | | 10 | 900 | 35.5 | 14250 | −10.0 |
| 19 | | | 12 | | 38.8 | 11170 | −9.3 |
| 20 | | | 15 | | 40.3 | 7430 | −8.6 |
| 21 | 0.25 | 1/8 | 0 | 1150 | 41.5 | 24900 | 12.3 |
| 22 | | | 10 | 900 | 40.4 | 11440 | 8.0 |
| 23 | | | 12 | | 42.4 | 9400 | 10.0 |
| 24 | | | 15 | | 45.0 | 7100 | 26.0 |
| 25 | 0.30 | 7/60 | 0 | 1150 | 44.7 | 22500 | 20.0 |
| 26 | | | 10 | 900 | 41.3 | 10260 | 31.0 |
| 27 | | | 12 | | 43.9 | 8280 | 41.0 |
| 28 | | | 15 | | 46.2 | 6300 | 64.3 |

The present invention relates to a dielectric LTCC composition for microwave frequency that has high dielectric constants, high Q values, and stable temperature coefficients of the resonant frequency, and that has a sintering temperature as low as ≦900° C. which can be co-fired without reacting with an electrode such as silver (Ag). The compositions are applied for their excellent characteristics required for commonly used cellular and PCS phones in the range of 800 MHz~1.9 GHz, and laminated chip filters and antennae in the range of IMT 2000 of 2 GHz, which will be used hereafter.

What is claimed is:

1. A low temperature co-firing ceramic (LTCC) composition for microwave frequency represented by the following formula 1:

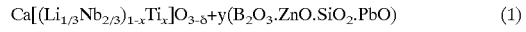

$$Ca[(Li_{1/3}Nb_{2/3})_{1-x}Ti_x]O_{3-\delta}+y(B_2O_3.ZnO.SiO_2.PbO) \quad (1)$$

wherein x is molar ratio and $0 \leq x \leq 0.3$; y is wt % ratio and $0 \leq y \leq 15$; and δ is a variable varying with the value of x and $7/60 \leq \delta \leq 1/6$.

* * * * *